(12) United States Patent
Sukegawa

(10) Patent No.: US 7,782,669 B2
(45) Date of Patent: Aug. 24, 2010

(54) MEMORY SYSTEM

(75) Inventor: Hiroshi Sukegawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 21 days.

(21) Appl. No.: 12/325,006

(22) Filed: Nov. 28, 2008

(65) Prior Publication Data

US 2009/0141552 A1    Jun. 4, 2009

(30) Foreign Application Priority Data

Nov. 29, 2007    (JP)    ............................. 2007-309096

(51) Int. Cl.
*G11C 16/04*    (2006.01)
(52) U.S. Cl. .............................. 365/185.03; 365/230.06
(58) Field of Classification Search ............ 365/185.03, 365/230.06
See application file for complete search history.

(56) References Cited

U.S. PATENT DOCUMENTS

2008/0106937 A1*    5/2008    Magnavacca et al. .. 365/185.03

FOREIGN PATENT DOCUMENTS

| JP | 2000-200891 | 7/2000 |
|---|---|---|
| JP | 2006-228394 | 8/2006 |

* cited by examiner

*Primary Examiner*—Hoai V Ho
*Assistant Examiner*—Jason Lappas
(74) *Attorney, Agent, or Firm*—Oblon, Spivak, McClelland, Maier & Neustadt, L.L.P.

(57) ABSTRACT

A memory system includes a nonvolatile memory including a plurality of memory cells, each memory cell being configured to store n levels (n is a natural number of not less than 3) in accordance with a threshold voltage, and a converter which encodes input data in the form of a bit string, records the encoded data in the nonvolatile memory, and limits a difference between levels which adjacent memory cells can take to not more than a predetermined level lower than the n levels.

12 Claims, 7 Drawing Sheets

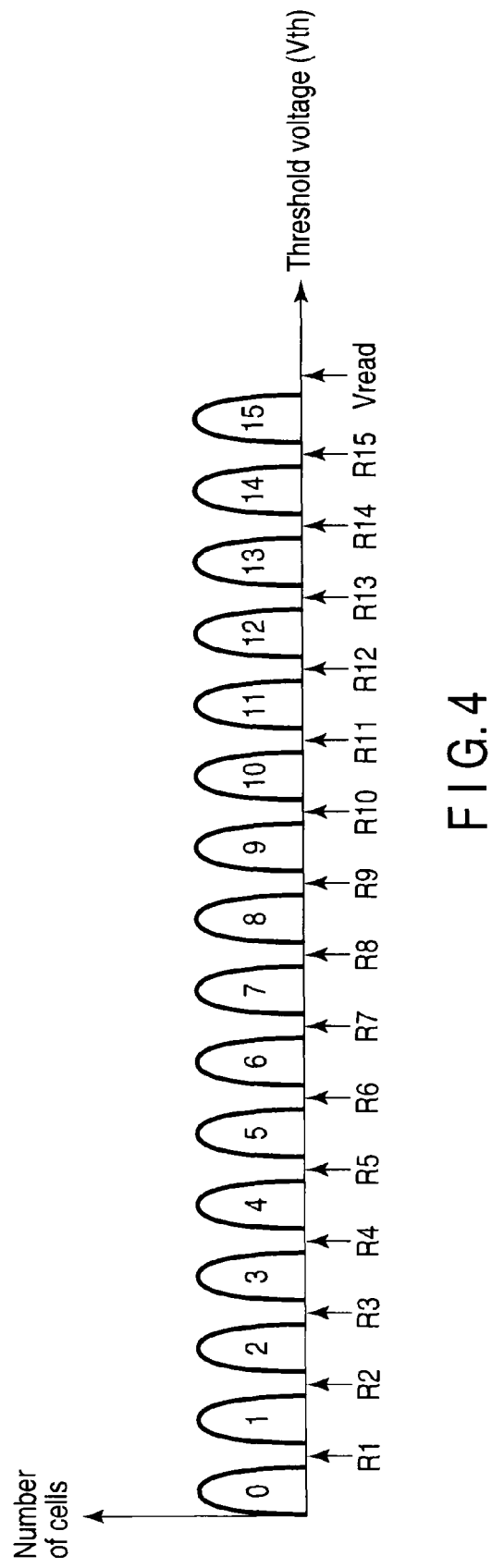
F I G. 4

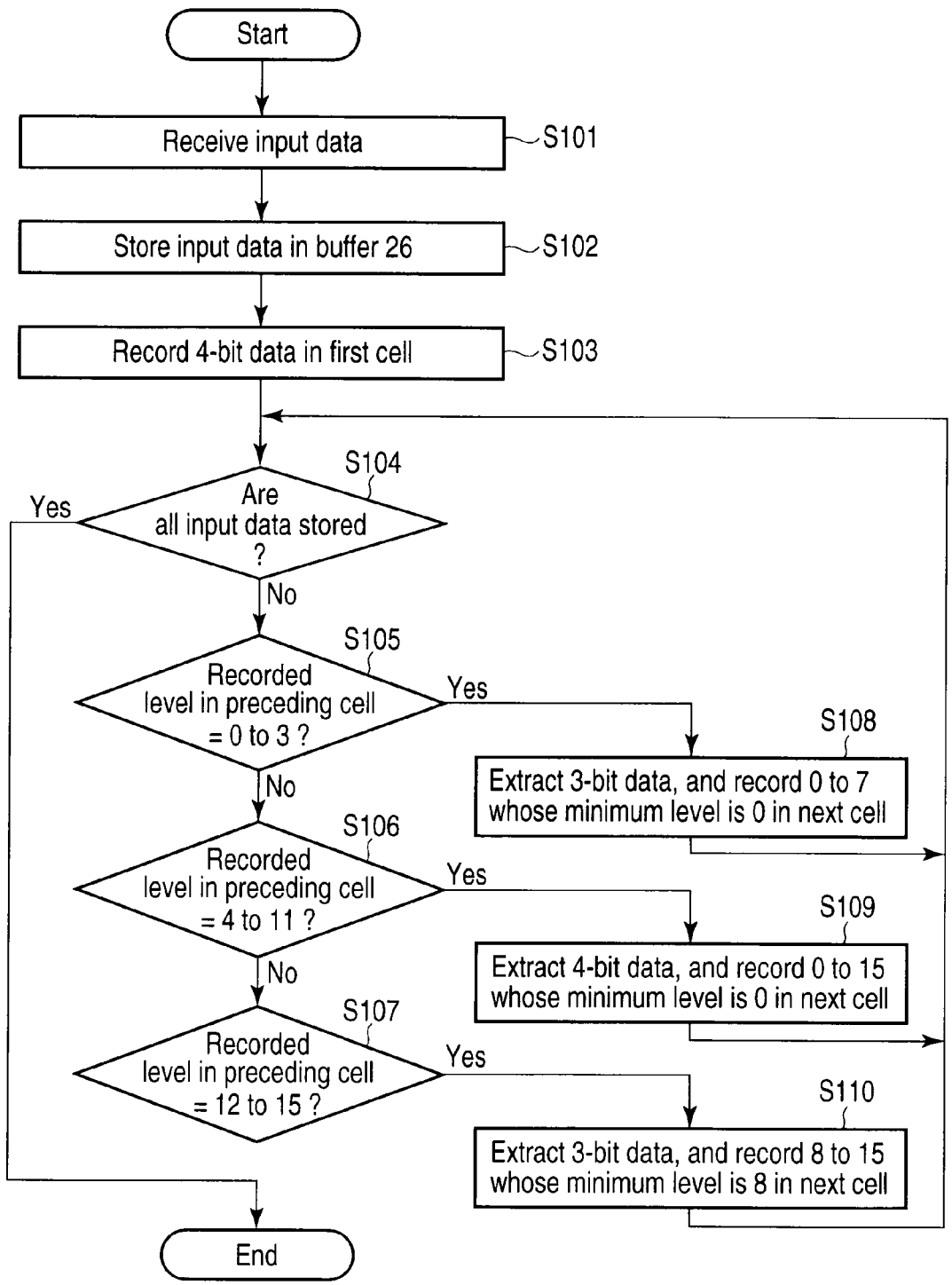
F I G. 5

MEMORY SYSTEM

CROSS-REFERENCE TO RELATED APPLICATIONS

This application is based upon and claims the benefit of priority from prior Japanese Patent Application No. 2007-309096, filed Nov. 29, 2007, the entire contents of which are incorporated herein by reference.

BACKGROUND OF THE INVENTION

1. Field of the Invention

The present invention relates to a memory system, e.g., a memory system including a nonvolatile memory such as a NAND flash memory.

2. Description of the Related Art

Recently, demands for large-capacity nonvolatile semiconductor memories are increasing with the rapid spread of digital cameras, portable audio players, and the like, and NAND flash memories are widely used as such nonvolatile semiconductor memories. In addition, to implement a large-capacity NAND flash memory, a multilevel NAND flash memory that stores data having a plurality of bits in one memory cell transistor has been proposed.

In the NAND flash memory, data is defined by the threshold voltage of a memory cell transistor. Accordingly, a plurality of threshold voltages are used to record multilevel data. Recently, the distance between memory cell transistors has shortened as micropatterning of elements advances. This increases the influence of the capacitance between the floating gate electrodes of adjacent memory cell transistors. More specifically, the threshold voltage of a memory cell transistor fluctuates owing to that of a memory cell transistor which is adjacent to the former memory cell transistor and in which data is to be written later.

In particular, a memory cell transistor used in a multilevel memory has a plurality of threshold values, so the threshold voltage distribution per data must be exceedingly narrowed. Accordingly, the problem that the threshold voltage fluctuates in accordance with data in an adjacent cell becomes significant in a multilevel memory. Furthermore, if the fluctuation in threshold voltage increases, recorded data is shifted one level (data drift occurs), so no high data reliability can be obtained.

As a related technique of this kind, a semiconductor memory data write method capable of improving the data reliability is disclosed (Jpn. Pat. Appln. KOKAI Publication No. 2006-228394).

BRIEF SUMMARY OF THE INVENTION

According to an aspect of the present invention, there is provided a memory system comprising:

a nonvolatile memory including a plurality of memory cells, each memory cell being configured to store n levels (n is a natural number of not less than 3) in accordance with a threshold voltage; and a converter which encodes input data in the form of a bit string, records the encoded data in the nonvolatile memory, and limits a difference between levels which adjacent memory cells can take to not more than a predetermined level lower than the n levels.

BRIEF DESCRIPTION OF THE SEVERAL VIEWS OF THE DRAWING

FIG. 4 is a graph showing the threshold voltage distributions of a memory cell transistor MT;

FIG. 5 is a flowchart showing a data recording operation of a controller 12;

DETAILED DESCRIPTION OF THE INVENTION

Figure 1:
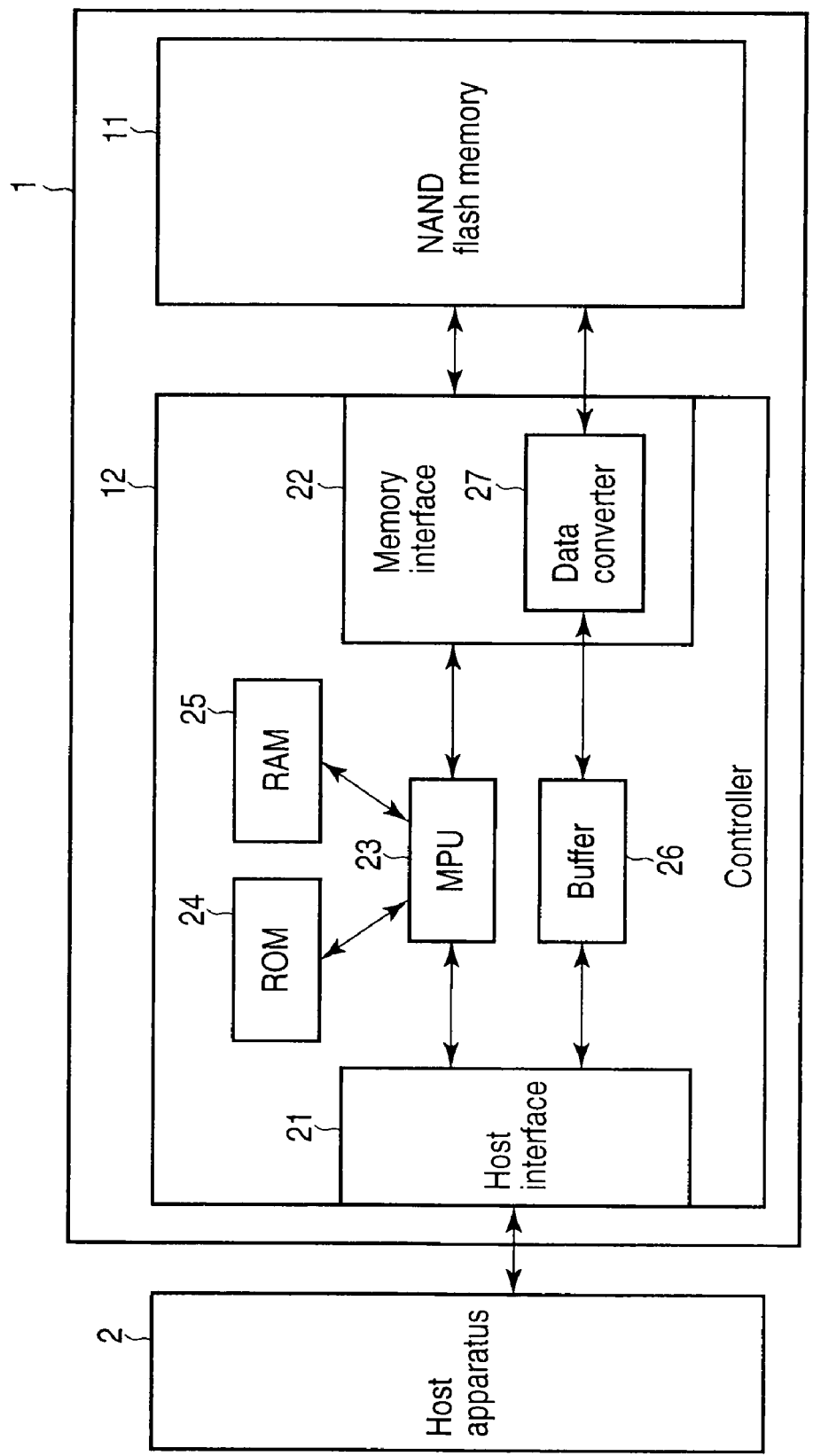
FIG. 1 is a block diagram showing the arrangement of a memory card 1 according to an embodiment of the present invention.

An embodiment of the present invention will be explained below with reference to the accompanying drawing. Note that in the following explanation, the same reference numerals denote elements having the same functions and arrangements, and a repetitive explanation will be made only when necessary.

This embodiment will be explained by taking a memory card as an example of a memory system. The memory card is designed to be detachable from a host apparatus. However, the present invention is not limited to the memory card, and the memory system and host apparatus may also be formed as one large-scale integrated circuit (LSI). That is, a controller and nonvolatile semiconductor memory forming the memory system may also be mounted on a printed circuit board on which the host apparatus is mounted.

FIG. 1 is a block diagram showing the configuration of a memory system (memory card) 1 according to the embodiment of the present invention. When connected to a host apparatus 2, the memory card 1 operates by receiving power supply, and performs an accessing process corresponding to a request from the host apparatus 2. The host apparatus 2 comprises hardware and software for accessing the memory card 1 connected via a bus interface.

The memory card 1 exchanges data with the host apparatus 2 via the bus interface. The memory card 1 comprises a NAND flash memory 11 as a kind of a nonvolatile memory, and a controller 12 for controlling the NAND flash memory 11. Note that the nonvolatile memory is not limited to the NAND flash memory 11, and various types of nonvolatile memories complying with this embodiment can be used.

The controller 12 manages the internal physical state (e.g., which physical block address contains what number of logical sector address data, or which block is in an erased state) of the NAND flash memory 11. The controller 12 comprises a host interface circuit (host interface) 21, memory interface circuit (memory interface) 22, microprocessing unit (MPU) 23, read-only memory (ROM) 24, random access memory (RAM) 25, buffer 26, and data converter 27.

The host interface circuit 21 interfaces the controller 12 with the host apparatus 2 in accordance with a predetermined protocol.

The MPU 23 controls the overall operation of the memory card 1. When the memory card 1 receives power supply, for example, the MPU 23 reads firmware (a control program) stored in the ROM 24 onto the RAM 25 and executes predetermined processing, thereby forming various tables on the RAM 25. Also, the MPU 23 receives a write command, read command, erase command, and the like from the host apparatus 2, and executes predetermined processing on the NAND flash memory 11, or controls data transfer by using the buffer 26.

The ROM 24 stores, e.g., the control program to be controlled by the MPU 23. The RAM 25 is used as a work area of the MPU 23, and stores the program loaded from the ROM 24 and various tables. The memory interface circuit 22 interfaces the controller 12 with the NAND flash memory 11 in accordance with a predetermined protocol.

The buffer 26 temporality stores a predetermined amount of data based on the host interface when writing input data transmitted from the host apparatus 2 into the NAND flash memory 11, or temporarily stores a predetermined amount of data when transmitting data read from the NAND flash memory 11 to the host apparatus 2.

The data converter 27 encodes input data transmitted from the host apparatus 2 into optimum information to be recorded in the NAND flash memory 11. The data converter 27 also decodes read data transmitted from the NAND flash memory 11 into optimum information to be transmitted to the host apparatus 2. Details of the operation of the data converter 27 will be described later.

The NAND flash memory 11 includes a plurality of blocks as data erase units. Each block contains a plurality of pages as data write units (or data read units).

Figure 2:
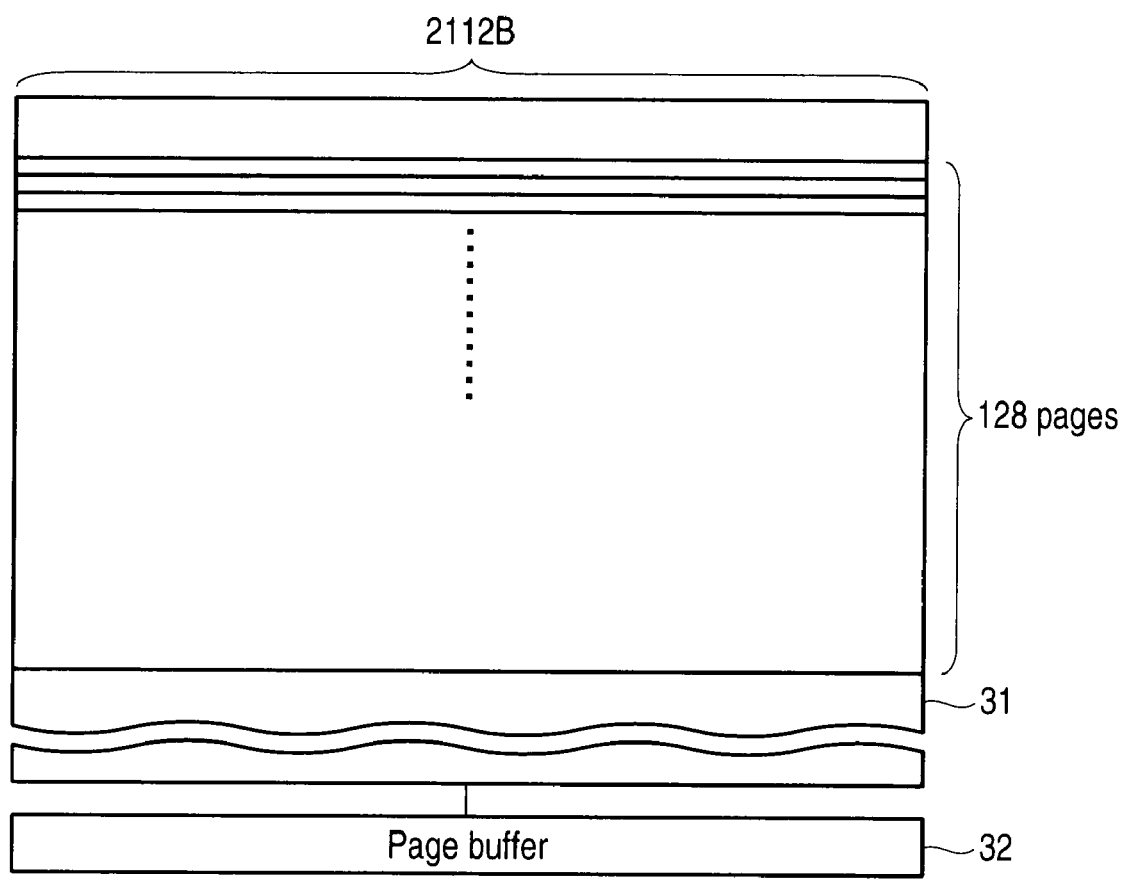
FIG. 2 is a schematic view showing the structure of a memory area 31 of a NAND flash memory 11.

FIG. 2 is a schematic view showing the arrangement of a memory area 31 of the NAND flash memory 11. Each page has, e.g., 2,112 bytes (B) (512-B data area×4+10-B ECC area×4+24-B management data area). For example, 128 pages form a block (256 KB+8 KB (K is 1,024)) as a data erase unit. Also, the NAND flash memory 11 includes a page buffer 32 for holding data page by page. In this embodiment, the storage capacity of the page buffer 32 is 2,112 B (2,048 B+64 B).

Figure 3:
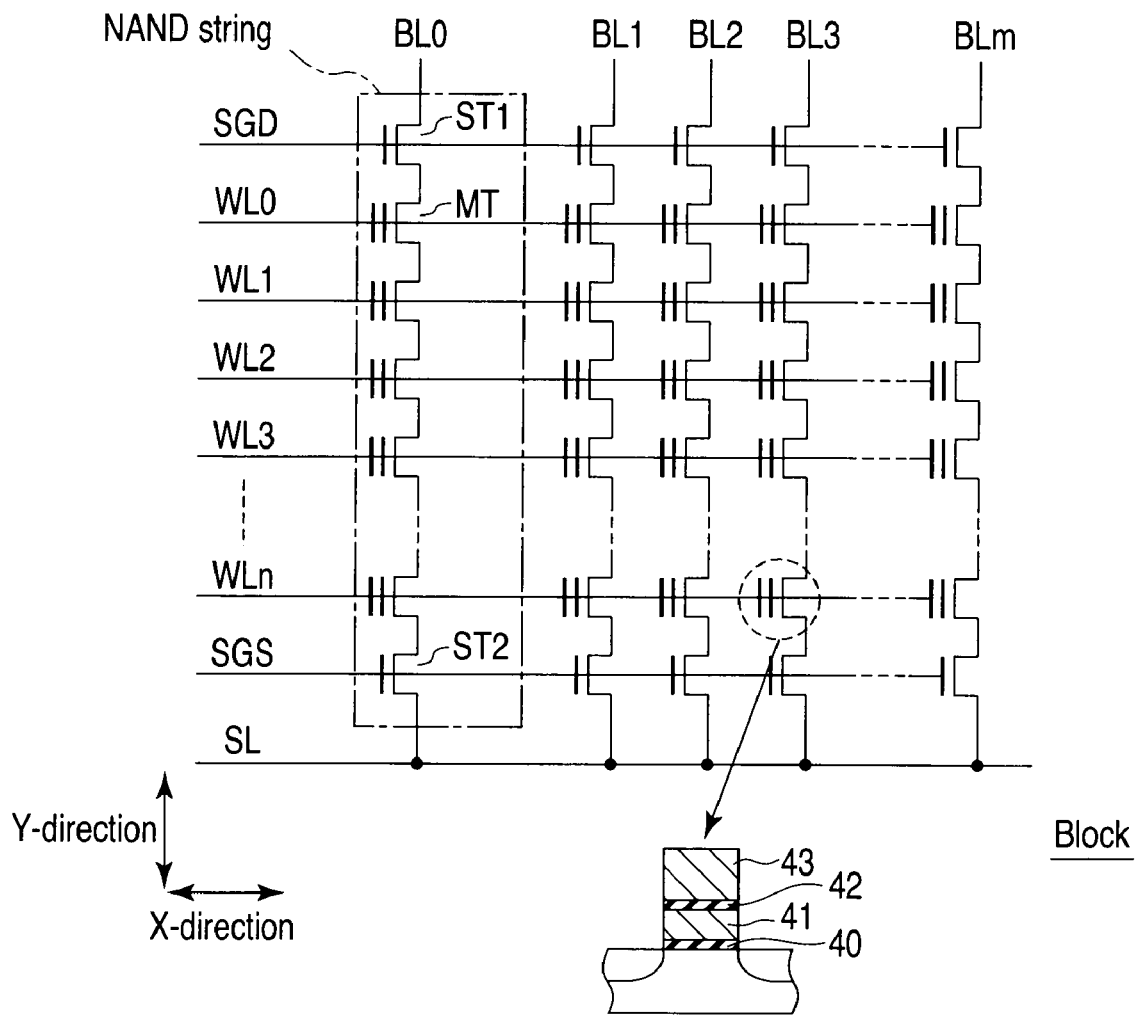
FIG. 3 is an equivalent circuit diagram showing the arrangement of one block included in the NAND flash memory 11.

FIG. 3 is an equivalent circuit diagram showing the arrangement of one block included in the NAND flash memory 11.

The block has (m+1) (m is a natural number of 1 or more) NAND strings arranged in order along the X-direction. Each NAND string includes selection transistors ST1 and ST2 and (n+1) (n is a natural number of 1 or more) memory cell transistors MT. The selection transistors ST1 included in the (m+1) NAND strings have drains connected to bit lines BL0 to BLm, and gates connected together to a selection gate line SGD. The selection transistors ST2 have sources connected together to a source line SL, and gates connected together to a selection gate line SGS.

Each memory cell transistor MT is a metal oxide semiconductor field-effect transistor (MOSFET) having a stacked gate structure formed on a gate insulating film 40 on a semiconductor substrate. The stacked gate structure includes a charge storage layer (floating gate electrode) 41 formed on the gate insulating film 40, and a control gate electrode 43 formed on an inter-gate insulating film 42 on the floating gate electrode 41. The memory cell transistor MT changes the threshold voltage in accordance with the number of electrons injected into the floating gate electrode 41, and stores data in accordance with the threshold voltage.

In each NAND string, the (n+1) memory cell transistors MT are arranged such that their current paths are connected in series between the source of the selection transistor ST1 and the drain of the selection transistor ST2. That is, the plurality of memory cell transistors MT are connected in series in the Y-direction so that adjacent transistors share the diffusion region (source region or drain region).

The control gate electrodes are connected to word lines WL0 to WLn in order from the memory cell transistor MT positioned closest to the drain side. Accordingly, the drain of the memory cell transistor MT connected to the word line WL0 is connected to the source of the selection transistor S/T1, and the source of the memory cell transistor MT connected to the word line WLn is connected to the drain of the selection transistor ST2.

The word lines WL0 to WLn connect the control gate electrodes of the memory cell transistors MT together between the NAND strings in the block. That is, the control gate electrodes of the memory cell transistors MT in the same row in the block are connected to the same word line WL. The (m+1) memory cell transistors MT connected to the same word line WL are processed as one page, and data write and read are performed page by page.

Also, the bit lines BL0 to BLm connect the drains of the selection transistors ST1 between the blocks. That is, the NAND strings in the same column in a plurality of blocks are connected to the same bit line BL.

The NAND flash memory 11 (more specifically, the memory cell transistor MT) according to this embodiment holds multilevel data (data having two or more bits). Note that multilevel data means data having three levels or more. This embodiment will be explained by taking hexadecimal data (4-bit data) as an example of multilevel data that the NAND flash memory 11 can hold. However, the present invention is of course not limited to this, and also applicable to a NAND flash memory for holding multilevel data other than hexadecimal data.

FIG. 4 is a view showing the threshold voltage distributions of the memory cell transistor MT. Referring to FIG. 4, the abscissa indicates a threshold voltage Vth, and the ordinate indicates the number of cells.

The memory cell transistor MT can hold 16 levels, i.e., 1 (1h), 2 (2h), 3 (3h), 4 (4h), 5 (5h), 6 (6h), 7 (7h), 8 (8h), 9 (9h), 10 (Ah), 11 (Bh), 12 (Ch), 13 (Dh), 14 (Eh), and 15 (Fh) in ascending order of the threshold voltage Vth. "h" means a hexadecimal number.

The memory cell transistor MT holding data "0" is in an erased state in which no electrons are injected into the floating gate electrode, and the threshold voltage Vth is set at Vth<R1. The threshold voltage Vth of the memory cell transistor MT holding data "1" is set at R1<Vth<R2. The threshold voltage Vth of the memory cell transistor MT holding data "14" is set at R14<Vth<R15. The threshold voltage Vth of the memory cell transistor MT holding data "15" is set at R15<Vth<Vread.

The above-mentioned read voltages (R1 to R15) for use in data read are applied to a selected word line. A read pass voltage Vread higher than the upper limit of all the data threshold voltage distributions is applied to unselected word lines and selected gate lines in a selected block. An unselected cell can be turned on by using the read pass voltage Vread regardless of held data. Therefore, a voltage of a selected word line can be discriminated by detecting whether a bit-line current flows on the basis of the data.

As described previously, one memory cell transistor MT can store 16 levels. That is, levels that the memory cell transistor MT can take have degrees of freedom 0 to 15. Since the memory cell transistor MT is set at a plurality of threshold voltages corresponding to the 16 levels, the threshold voltage distribution per data is very narrow.

Accordingly, the threshold voltages of adjacent memory cell transistors fluctuate in accordance with data owing to the capacitance (inter-floating gate capacitance) between the floating gate electrodes. If this fluctuation is large, recorded data is shifted one level (data drift occurs), so no high data reliability can be obtained. Also, the fluctuation in threshold voltage increases as the difference between recorded data in adjacent memory cell transistors increases.

In this embodiment, therefore, the difference between the levels of adjacent memory cell transistors is limited while the degrees of freedom of each memory cell transistor are held at 16. That is, the difference between levels that adjacent memory cell transistors can take is defined within the range of "±11". Note that this level difference is set at a value by which an error occurs, i.e., recorded data is shifted one level. Conditions under which data drift occurs change in accordance with, e.g., the characteristics and size of the memory cell transistor MT, and a voltage used to record data. Therefore, the difference between levels that adjacent memory cell transistors can take can be freely set in accordance with the above conditions.

To set the difference between levels that adjacent memory cell transistors can take as described above, 16 levels (4-bit data) or 8 levels (3-bit data) are recorded in each memory cell transistor in accordance with data in an adjacent cell. More specifically, a recording operation of one of (1) to (3) below is executed.

(1) If "0 to 3" of degrees of freedom "0 to 15" are recorded in a certain cell, 8 levels (3-bit data) whose minimum level is 0, i.e., levels "0 to 7" are recorded in the next cell. This is so because the difference between a maximum level of 15 and "0 to 3" exceeds a limiting value of 11, so only 3-bit data can be recorded in a cell as a write object.

(2) If "4 to 11" of degrees of freedom "0 to 15" are recorded in a certain cell, 16 levels (4-bit data), i.e., levels "0 to 15" are recorded in the next cell for the following reason. That is, the difference between the levels of adjacent cells does not exceed 11 regardless of which of "0 to 15" is recorded in a cell as a write object. Accordingly, data having four bits as a maximum number of recordable bits can be recorded in the cell as a write object.

(3) If "12 to 15" of degrees of freedom "0 to 15" are recorded in a certain cell, 8 levels (3-bit data) whose minimum level is 8, i.e., levels "8 to 15" are recorded in the next cell. This is so because the difference between a minimum level of 0 and "12 to 15" exceeds a limiting value of 11, so only 3-bit data can be recorded in a cell as a write object.

By the control as described above, the difference between levels that adjacent memory cell transistors can take can be limited within the range of "±11", while the degrees of freedom of each memory cell transistor are held at 16.

Note that a maximum level to be recorded in each memory cell transistor is the power of 2. Note also that the number of levels to be recorded in each memory cell transistor has a base of the power of 2. The arithmetic processing can be simplified by satisfying these conditions. In this embodiment, the maximum level is 16, and the number of levels to be recorded in each memory cell transistor is an octal or hexadecimal number. That is, both the maximum level and the number of levels satisfy the above conditions.

The operation of the memory card 1 (controller 12) having the above arrangement will be explained below. First, a data write (recording) operation of the controller 12 will be explained. FIG. 5 is a flowchart showing the data recording operation of the controller 12.

Figure 6:
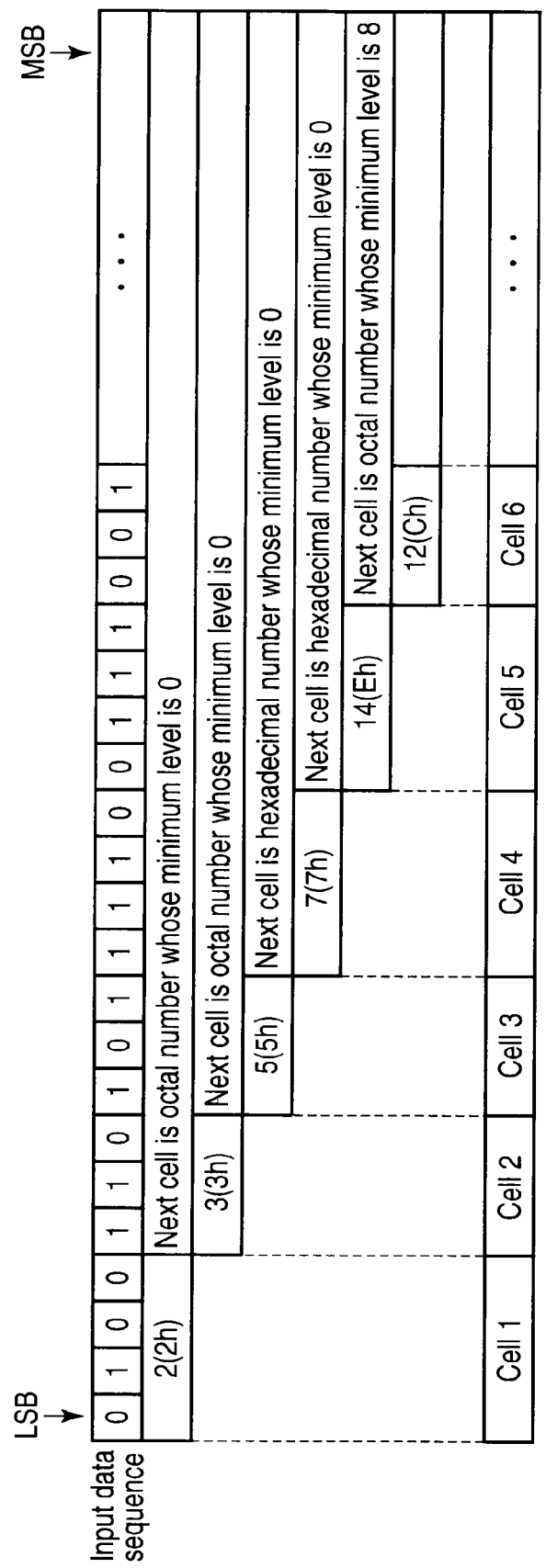
FIG. 6 is a view showing an example of an input data sequence.

The host apparatus 2 transmits data to be recorded on the memory card 1 as input data to the memory card 1. This input data is a bit string including a plurality of bits. The controller 12 receives the input data from the host apparatus 2 (step S101). The controller 12 stores the input data in the buffer 26 (step S102). FIG. 6 is a view showing an example of the input data sequence. The input data is transmitted to the memory card 1 in order from the least significant bit (LSB) shown in FIG. 6. That is, the input data is a bit string that starts from the LSB and continues to the most significant bit (MSB).

Subsequently, the data converter 27 records data in the first memory cell transistor (cell 1). In this case, no data is recorded in an adjacent cell. Therefore, the data converter 27 extracts 4-bit data from the start of the input data sequence, and records, in cell 1, a level obtained by converting (encoding) this 4-bit data into a hexadecimal number whose minimum level is 0 (step S103). In the example shown in FIG. 6, the 4-bit data is "0010", so a level of 2 (2h) is recorded in cell 1. Note that in this embodiment, an adjacent cell means a cell connected to the same word line WL and adjacent in the X-direction, because data is written page by page.

Then, the controller 12 checks whether all the input data are recorded in the NAND flash memory 11 (step S104). If not all the input data are recorded, the controller 12 records data in the next cell.

That is, the data converter 27 checks which of the three ranges of "0 to 3", "4 to 11", and "12 to 15" the recorded level in a preceding cell (a cell immediately before a cell as a record object) corresponds to (steps S105 to S107).

If it is determined in step S105 that the recorded level in the preceding cell falls within the range of "0 to 3", the data converter 27 extracts the next 3-bit data. The data converter 27 then converts (encodes) the 3-bit data into an octal number (i.e., "0 to 7") whose minimum level is 0, and records this converted level in the next cell (step S108). In the example shown in FIG. 6, the recorded level in cell 1 is 2h, so step S108 is executed. That is, since the next 3-bit data is "011", a level of 3 (3h) is recorded in cell 2.

If it is determined in step S106 that the recorded level in the preceding cell falls within the range of "4 to 11", the data converter 27 extracts the next 4-bit data. The data converter 27 then converts the 4-bit data into a hexadecimal number (i.e., "0 to 15") whose minimum level is 0, and records this converted level in the next cell (step S109).

If it is determined in step S107 that the recorded level in the preceding cell falls within the range of "12 to 15", the data converter 27 extracts the next 3-bit data. The data converter 27 then converts the 3-bit data into an octal number (i.e., "8 to 15") whose minimum level is 8, and records this converted level in the next cell (step S110).

After that, the operations in steps S105 to S110 are repeated until it is determined in step S104 that all the input data are recorded in the NAND flash memory 11.

In the example shown in FIG. 6, the recorded level in cell 2 is 3h, so a level obtained by converting 3-bit data into an octal number (i.e., "0 to 7") whose minimum level is 0 is recorded in the next cell (cell 3). That is, since the next 3-bit data is "101", a level of 5 (5h) is recorded in cell 3.

Subsequently, since the recorded level in cell 3 is 5h, a level obtained by converting 4-bit data into a hexadecimal number (i.e., "0 to 15") whose minimum level is 0 is recorded in the next cell (cell 4). That is, the next 4-bit data is "0111", so a level of 7 (7h) is recorded in cell 4.

Since the recorded level in cell 4 is 7h, a level obtained by converting 4-bit data into a hexadecimal number (i.e., "0 to 15") whose minimum level is 0 is recorded in the next cell (cell 5). That is, the next 4-bit data is "1110", so a level of 14 (Eh) is recorded in cell 5.

Then, since the recorded level in cell 5 is Eh, a level obtained by converting 3-bit data into an octal number (i.e., "8 to 15") whose minimum level is 8 is recorded in the next cell (cell 6). That is, the next 3-bit data is "100", so a level of 12 (Ch) is recorded in cell 6.

By performing the recording operation by imposing the limitations as described above, the difference between levels that adjacent memory cell transistors can take is set within the range of "±11". This makes it possible to suppress an error caused by the inter-floating gate capacitance, and improve the data reliability.

Figure 7:
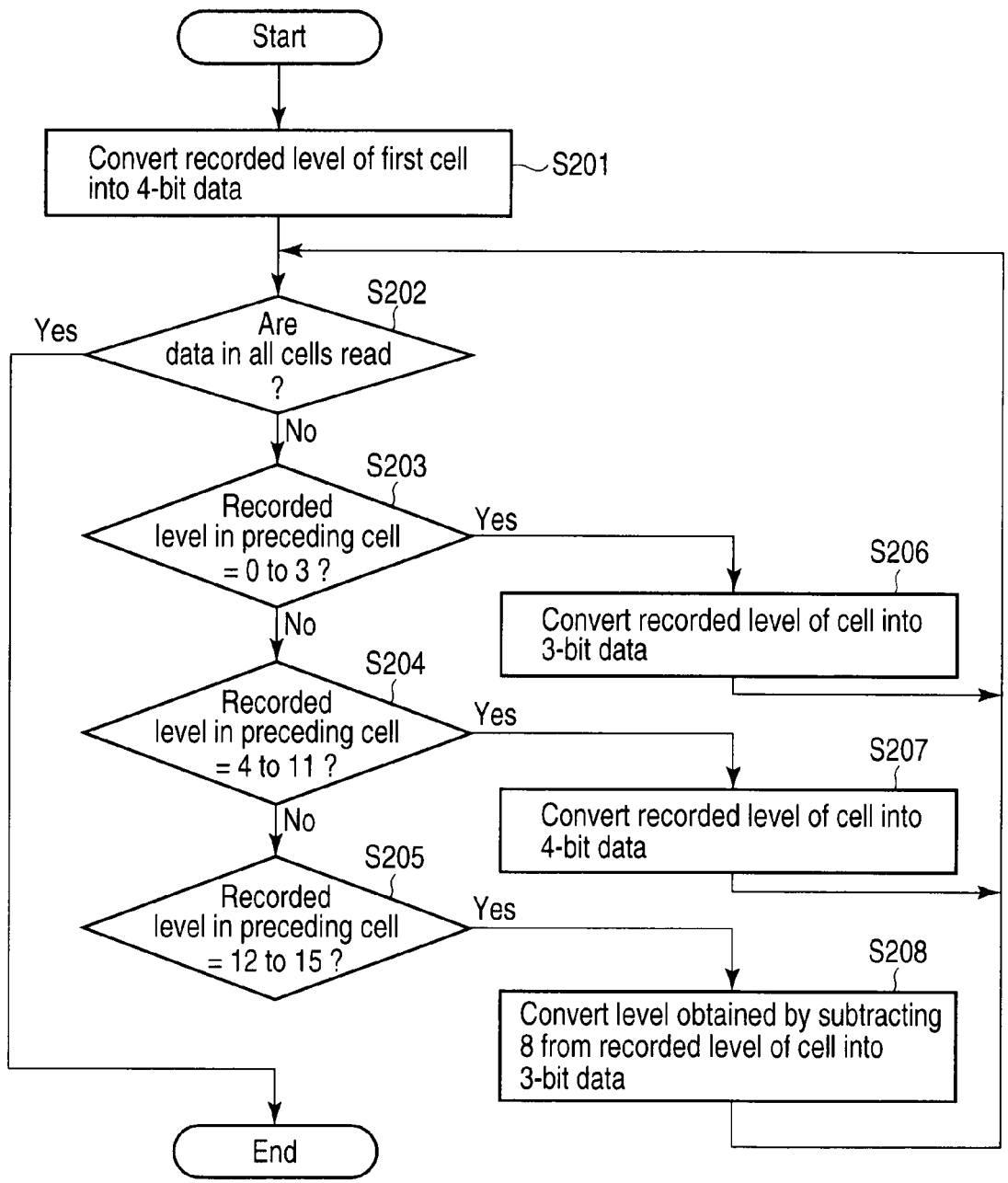
FIG. 7 is a flowchart showing a data read operation of the controller 12.

A data read operation of the controller 12 will now be explained. FIG. 7 is a flowchart showing the data read operation of the controller 12.

The host apparatus 2 issues a data read request to the memory card 1. In response to this request, the NAND flash memory 11 sends read data to the controller 12 via the page buffer 32.

The data converter 27 converts (decodes) a recorded level (hexadecimal number) in the first cell into 4-bit data (step S201). The buffer 26 stores the converted 4-bit data. Subsequently, the controller 12 checks whether data in all cells as read objects are read (step S202). If data in not all the cells are read, the controller 12 reads data from the next cell.

That is, the data converter 27 checks which of the three ranges of "0 to 3", "4 to 11", and "12 to 15" the recorded level in a preceding cell (a cell immediately before a cell as a read object) corresponds to (steps S203 to S205).

If it is determined in step S203 that the recorded level in the preceding cell falls within the range of "0 to 3", the data converter 27 determines that the recorded level in the cell as a read object is an octal number whose minimum level is 0. This is so because the difference between a maximum level of 15 and "0 to 3" exceeds a limiting level of 11, so only 3-bit data is recorded in the cell as a read object. Accordingly, the data converter 27 converts (decodes) the recorded level in the cell as a read object into 3-bit data. The buffer 26 stores the converted 3-bit data.

If it is determined in step S204 that the recorded level in the preceding cell falls within the range of "4 to 11", the data converter 27 determines that the recorded level in the cell as a read object is a hexadecimal number whose minimum level is 0 for the following reason. That is, the difference between the levels of adjacent cells does not exceed 11 regardless of which of "0 to 15" is recorded in the cell as a read object, so 4-bit data having a maximum number of recordable bits is recorded in the cell as a read object. Therefore, the data converter 27 converts the recorded level in the cell as a read object into 4-bit data. The buffer 26 stores the converted 4-bit data.

If it is determined in step S205 that the recorded level in the preceding cell falls within the range of "12 to 15", the data converter 27 determines that the recorded level in the cell as a read object is an octal number whose minimum level is 8. This is so because the difference between a minimum level of 0 and "12 to 15" exceeds a limiting level of 11, so only 3-bit data is recorded in the cell as a read object. Accordingly, the data converter 27 converts a level obtained by subtracting 8 from the recorded level in the cell as a read object into 3-bit data. The buffer 26 stores the converted 3-bit data.

After that, the operations in steps S202 to S208 are repeated until the data in all the cells as read objects are read from the NAND flash memory 11. The bit string stored in the buffer 26 is transmitted as output data to the host apparatus 2.

As has been described in detail above, this embodiment includes the NAND flash memory 11 capable of recording multilevel data (a plurality of bits) in each memory cell transistor MT. Input data in the form of a bit string transmitted from the host apparatus 2 is converted (encoded) into multi-level information, and the information is recorded in the NAND flash memory 11. In addition, the difference between levels that adjacent memory cell transistors can take is limited to a predetermined value or less.

In this embodiment, therefore, the fluctuation in threshold voltage caused by the inter-floating gate capacitance can be reduced while degrees of freedom determined by physical conditions such as the breakdown voltage are held as multiple levels recordable in each memory cell transistor MT. This makes it possible to suppress an error caused by the inter-floating gate capacitance, and improve the data reliability.

Also, the memory system of this embodiment can increase the amount of information storable in each memory cell transistor MT. This increases the information amount and improves the data reliability at the same time.

Furthermore, the fluctuation in threshold voltage can be reduced by limiting the difference between levels that adjacent memory cell transistors can take to a predetermined value or less. Therefore, the recording density of the NAND flash memory 11 can be increased. This makes downsizing of the NAND flash memory 11 feasible.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A memory system comprising:
a nonvolatile memory including a plurality of memory cells, each memory cell being configured to store n levels (n is a natural number of not less than 3) in accordance with a threshold voltage; and
a converter which encodes input data in the form of a bit string, records the encoded data in the nonvolatile memory, and limits a difference between levels which adjacent memory cells can take to not more than a predetermined level lower than the n levels.

2. The system according to claim 1, wherein
the memory cell has n threshold voltages corresponding to the n levels, and
the n threshold voltages increase sequentially as the n levels increase.

3. The system according to claim 1, wherein when encoding the input data, the converter changes the number of bits to be recorded in the memory cell.

4. The system according to claim 1, wherein
the nonvolatile memory includes a first memory cell and a second memory cell adjacent to each other, and
the converter determines the number of bits to be recorded in the second memory cell, on the basis of a level recorded in the first memory cell.

5. The system according to claim 4, wherein the converter limits the number of bits to be recorded in the second memory cell to not more than the predetermined level by making the number of bits smaller than a maximum number of bits for recording the n levels.

6. The system according to claim 4, wherein if a difference between a level of the first memory cell and one of a minimum level and a maximum level is larger than the predetermined level, the converter makes the number of bits of the second memory cell smaller than a maximum number of bits for recording the n levels.

7. The system according to claim 1, wherein the converter decodes a level read from the nonvolatile memory into a bit string.

8. The system according to claim 7, wherein
the nonvolatile memory includes a first memory cell and a second memory cell adjacent to each other, the first memory cell being a read object, data being read from the second memory cell before data is read from the first memory cell, and
the converter determines the number of bits of a level read from the first memory cell, on the basis of a level of the second memory cell.

9. The system according to claim 8, wherein if a difference between the level of the second memory cell and one of a minimum level and a maximum level is larger than the predetermined level, the converter makes the number of bits of the first memory cell smaller than a maximum number of bits for recording the n levels.

10. The system according to claim 1, wherein n is the power of 2.

11. The system according to claim 1, wherein
the memory cell has a stacked structure in which a gate insulating film, a floating gate electrode, an inter-gate insulating film, and a control gate electrode are sequentially stacked, and
the threshold voltage changes in accordance with a charge amount in the floating gate electrode.

12. The system according to claim 1, wherein the nonvolatile memory is a flash memory.

* * * * *